(12) United States Patent
Honda et al.

(10) Patent No.: US 7,355,175 B2
(45) Date of Patent: Apr. 8, 2008

(54) METHOD AND APPARATUS FOR AUTOMATICALLY CORRECTING CHARGED-PARTICLE BEAM AND METHOD OF CONTROLLING ABERRATION CORRECTOR FOR CHARGED-PARTICLE BEAM

(75) Inventors: Kazuhiro Honda, Tokyo (JP); Natsuko Nakamura, Tokyo (JP); Shinobu Uno, Tokyo (JP); Joachim Zach, Heidelberg (DE)

(73) Assignee: Jeol Ltd., Tokyo (JP)

( * ) Notice: Subject to any disclaimer, the term of this patent is extended or adjusted under 35 U.S.C. 154(b) by 244 days.

(21) Appl. No.: 11/293,846

(22) Filed: Dec. 2, 2005

(65) Prior Publication Data

US 2006/0169895 A1 Aug. 3, 2006

(51) Int. Cl.
*G01N 23/00* (2006.01)
*G21K 7/00* (2006.01)

(52) U.S. Cl. ............... 250/310; 250/396; 250/311; 250/397; 250/398; 250/492.3; 250/305; 250/306

(58) Field of Classification Search ............ 250/396, 250/310, 311, 397, 398, 492.23, 305, 306
See application file for complete search history.

(56) References Cited

U.S. PATENT DOCUMENTS 6,723,997 B2 * 4/2004 Matsuya et al. ......... 250/396 R
6,858,844 B2 * 2/2005 Zach ..................... 250/310
7,145,154 B2 * 12/2006 Uno ..................... 250/396 R

OTHER PUBLICATIONS

"Aberration correction and its automatic control in scanning electron microscopes" Shinobu Uno, Kazuhiro Honda, Natsuko Nakamura, Miyuki Matsuya and Joachim Zach, Optik 116, 2005, pp. 438 to 448, Publication date: Sep. 2, 2005.*

Joachim Zach and Maximilian Haider, "Aberration correction in a low voltage SEM by a multipole corrector", *Nuclear Instruments and Methods in Physics Research*, Section A 363 (1995), pp. 316-325, Germany.

* cited by examiner

*Primary Examiner*—Jack I. Berman
*Assistant Examiner*—Meenakshi S Sahu
(74) *Attorney, Agent, or Firm*—The Webb Law Firm

(57) ABSTRACT

There is disclosed a method and apparatus for automatically correcting a charged-particle beam with an aberration corrector without the operator performing manual operations. The apparatus has an extraction portion for extracting the profile of the beam from images of a surface of a sample, a calculation unit for calculating the amount of axial deviation of the apparatus from the position of the extracted profile of the beam, and a feedback unit for automatically applying feedback to the aberration corrector or to the objective lens according to the calculated amount of axial deviation.

26 Claims, 6 Drawing Sheets

METHOD AND APPARATUS FOR AUTOMATICALLY CORRECTING CHARGED-PARTICLE BEAM AND METHOD OF CONTROLLING ABERRATION CORRECTOR FOR CHARGED-PARTICLE BEAM

BACKGROUND OF THE INVENTION

1. Field of the Invention

The present invention relates to a method and apparatus for automatically correcting aberrations in a charged-particle beam and also to a method of controlling an aberration corrector for a charged-particle beam.

2. Description of Related Art

A scanning electron microscope (SEM) is an example of a surface imaging apparatus using charged particles. A surface imaging apparatus is described, taking a scanning electron microscope as an example. FIG. 7 is a diagram showing the structure of a prior art scanning electron microscope equipped with an aberration corrector. The microscope has an emitter 1 emitting an electron beam 2. The trajectory of the beam 2 incident on the aberration corrector 6 is controlled by a lens 3 acting on the beam 2. The beam 2 transmitted through the corrector 6 is focused onto the surface of a sample 5 by an objective lens 4. At this time, the aberration corrector 6 corrects the aberration of the total lens system.

The sample surface is scanned with the electron beam 2. Secondary electrons 7 are emitted from the sample surface in synchronism with the scanning and are detected by a secondary electron detector 8. Information about the sample surface based on the detected secondary electrons 7 is displayed as a visible image on a CRT 12 in synchronism with the scan signal. Normally, the efficiency of the secondary electron detector 8 which detects secondary electrons 7 is low. Therefore, noise is removed by an image accumulator 9. The image from which the noise has been removed in this way is displayed on the CRT 12. An aberration corrector equipped with multipole elements is known as an example of such aberration corrector 6 (see, for example, Zach et al. "Aberration correction in a low voltage SEM by a multipole corrector" (Nuclear Instruments and Methods in Physics Research, A 363 (1995), 316-325).

The technique disclosed in the cited reference is described below as an example. FIG. 8 is a diagram showing the configuration of an aberration corrector and the trajectory of an electron beam passing through the corrector. The aberration corrector, indicated by numeral 6, has four stages of multipole elements, which are shown, respectively, as first stage of multipole elements 6a, second stage of multipole elements 6b, third stage of multipole elements 6c, and fourth stage of multipole elements 6d. Normally, each stage of multipole elements has eight or more pole elements. The electron beam 2 incident on the aberration corrector 6 undergoes a focusing action and a diverging action simultaneously by the lens action of the first stage of multipole elements 6a. As shown, it is assumed that the electron beam 2 undergoes the diverging action in an X trajectory 6e and that the beam 2 undergoes the focusing action in a Y trajectory 6f.

The lens strength of the first stage of multipole elements 6a is so adjusted that the Y trajectory 6f passes through the center of a lens field produced by the second stage of multipole elements 6b and is focused in the Y-direction. The lens strength of the second stage of multipole elements 6b is so adjusted that the X trajectory 6e passes through the center of a lens field produced by the third stage of multipole elements 6c and is focused in the X-direction. At this time, in the second stage of multipole elements 6b, the Y trajectory 6f passes through the center of the lens field produced by the second stage of multipole elements 6b and is focused in the Y-direction and so only the X trajectory 6e undergoes the lens action of the second stage of multipole elements 6b. Similarly, in the third stage of multipole elements 6c, the trajectory 6e passes through the center of the lens field produced by the third stage of multipole elements 6c and is focused in the X-direction. Therefore, only the Y trajectory 6f undergoes the lens action of the third stage of multipole elements 6c. In this way, the requirement is that the Y trajectory 6f of the electron beam 2 is focused on and passes through the center of the lens field produced by the second stage of multipole elements 6b and the X trajectory 6e of the beam 2 is focused on and passes through the center of the lens field produced by the third stage of multipole elements 6c.

In the prior art, these corrections (alignments) of the trajectories of the electron beam have been made by adjusting the lens strengths of the plural stages of multipole elements 6a-6d while viewing the amount of movement of the image produced when the lens strengths of the stages of multipole elements 6a-6d are wobbled.

In particular, there are mechanical deviations among the center axes of the various stages of multipole elements 6a-6d. It is difficult to correct these mechanical deviations of the center axes among the stages of multipole elements 6a-6d by adjusting the mechanical positions of the stages of multipole elements 6a-6d. Accordingly, the conventional method is to adjust the lens field strength electrically produced by the stages of multipole elements 6a-6d to the appropriate electron beam pass. Consequently, substantial hindrance is prevented even if there are mechanical positional deviations among the stages of multipole elements 6a-6d.

The lens fields produced by the stages of multipole elements 6a-6d contain dipole and quadrupole fields. When the dipole field produced by the multipole elements to be adjusted is adjusted, the quadrupole field produced by the multipole elements located behind the multipole elements to be adjusted is made to wobble. The dipole field produced by the multipole elements to be adjusted is adjusted such that the image taken during the wobbling does not move. In this way, the trajectory of the electron beam is aligned.

As described previously, it is necessary that the Y trajectory 6f of the beam 2 is focused on and passes through the center of the lens field produced by the second stage of multipole elements 6b and the X trajectory 6e of the beam 2 is focused on and passes through the center of the lens field produced by the third stage of multipole elements 6c. To achieve this requirement, the quadrupole fields produced by the stages of multipole elements 6a-6d need to be adjusted. During this adjustment, the dipole field produced by the multipole elements located next to the multipole elements to be adjusted is made to wobble. The quadrupole field produced by the multipole elements to be adjusted is adjusted such that the image obtained during the wobbling of the dipole field does not shift. In this way, the trajectory of the electron beam pass is aligned.

The procedure of adjustment of the dipole field produced by the aforementioned multipole elements is linked to the procedure for adjustment of the quadrupole fields produced by the other multipole elements such that the electron beam trajectory adjusted by one of these two kinds of fields is affected by adjustment of the other kind of field. Therefore, the operator has spent a long time in adjusting the lens field (multipole field) of each multipole element while checking the motion and quality of the image during wobbling, relying on his experience and intuition.

As described previously, in the aberration corrector composed of multiple stages of multipole elements, there are deviations among the mechanical center axes of the stages of multipole elements. By adjusting the multipole fields (dipole and quadrupole fields) produced by the stages of multipole elements by the aforementioned method (i.e., given multipole field produced by the multipole elements located behind the multipole elements to be adjusted is made to wobble), the operator empirically aligns the trajectory of the electron beam such that the beam is focused and passes through the center of the corresponding stages of multipole elements within the aberration corrector.

To achieve this, the operator manually adjusts and corrects the lens strengths of the stages of multipole elements. These procedural operations are complexly linked. There is the problem that the operator spends a lot of time in making the manual adjustment according to the movement and quality of the image while relying on his experience and intuition.

SUMMARY OF THE INVENTION

It is an object of the present invention to provide a method and apparatus for automatically correcting the trajectory of a charged-particle beam without a normal operator manually adjusting an aberration corrector. It is another object to provide a method of controlling an aberration corrector for a charged-particle beam.

A method of automatically correcting a charged-particle beam in accordance with the invention comprises the steps of: irradiating a sample with the charged-particle beam via an aberration corrector and an objective lens, the aberration corrector having stages of multipole elements; obtaining information about a cross section of the charged-particle beam based on plural images of a surface of the irradiated sample; calculating an amount of axial deviation of the optical axis of the charged-particle beam relative to the center of a multipole field in the aberration corrector based on the obtained information about the cross section of the beam; automatically applying feedback to the aberration corrector or to the objective lens according to the calculated amount of axial deviation.

An apparatus for automatically correcting a charged-particle beam in accordance with the present invention comprises: a cross-sectional information-obtaining device for obtaining information about a cross section of the charged-particle beam based on plural images of a surface of a sample irradiated with the beam via an aberration corrector and via an objective lens, the corrector being equipped with multipole elements; a calculator for calculating an amount of axial deviation of the optical axis of the beam relative to the center of a multipole field in the aberration corrector based on the obtained information about the cross section of the beam; and a feedback circuit for automatically applying feedback to the aberration corrector or to the objective lens according to the calculated amount of axial deviation.

Another apparatus for automatically correcting a charged-particle beam in accordance with the present invention comprises: an aberration corrector for correcting aberration in the beam, the corrector being equipped with stages of multipole elements; an aberration correction controller for controlling the strength of a multipole field produced by the aberration corrector; an objective lens; a control unit for supplying a control signal to the aberration correction controller or to the objective lens; a cross-sectional information-obtaining device for obtaining a SEM image in synchronism with operation of the control unit to obtain information about a cross section of the beam; an axial deviation quantification device for obtaining a quantified amount of the axial deviation of the optical axis of the beam from the obtained information about the cross section of the beam; a decision unit for making a decision from the quantified amount of axial deviation as to whether an automated correction is completed or not; and a feedback circuit for producing an amount of feedback to the aberration correction controller or to the objective lens from the quantified amount of axial deviation.

In the method of controlling the aberration corrector for the charged-particle beam, the corrector is made up of plural stages of multipole elements. The control unit controls the whole aberration corrector as a single lens. During the control operation, the ratio of the strengths of the lenses of the stages of multipole elements is kept constant.

Furthermore, the present invention provides another method of controlling an aberration corrector for a charged-particle beam, the corrector being made up of plural stages of multipole elements. In this method, a control unit controls the whole aberration corrector as a single lens. During the control operation, the ratio of the strengths of the lenses of the stages of multipole elements and the objective lens is kept constant.

The method of automatically correcting a charged-particle beam in accordance with the present invention makes it possible for the operator to automatically correct the beam without relying on manual operations.

The apparatus for automatically correcting a charged-particle beam in accordance with the present invention similarly permits automated correction of the beam without relying on operator's manual operations.

According to the method of controlling an aberration corrector for a charged-particle beam in accordance with the present invention, the whole aberration corrector can be controlled as a single lens with one control signal by maintaining the ratio of the strengths of the lenses formed by the stages of multipole elements constant. Axial deviation can be corrected well by simplifying the control system.

In addition, according to the other method of controlling an aberration corrector for a charged-particle beam in accordance with the present invention, the whole aberration corrector can be controlled as a single lens with one control signal by maintaining the ratio of the strengths of the stages of multipole lenses and objective lens constant. Axial deviation can be corrected well by simplifying the control system.

Other objects and features of the invention will appear in the course of the description thereof, which follows.

DESCRIPTION OF THE PREFERRED EMBODIMENTS

The preferred embodiments of the present invention are hereinafter described in detail with reference to the accompanying drawings.

Figure 1:
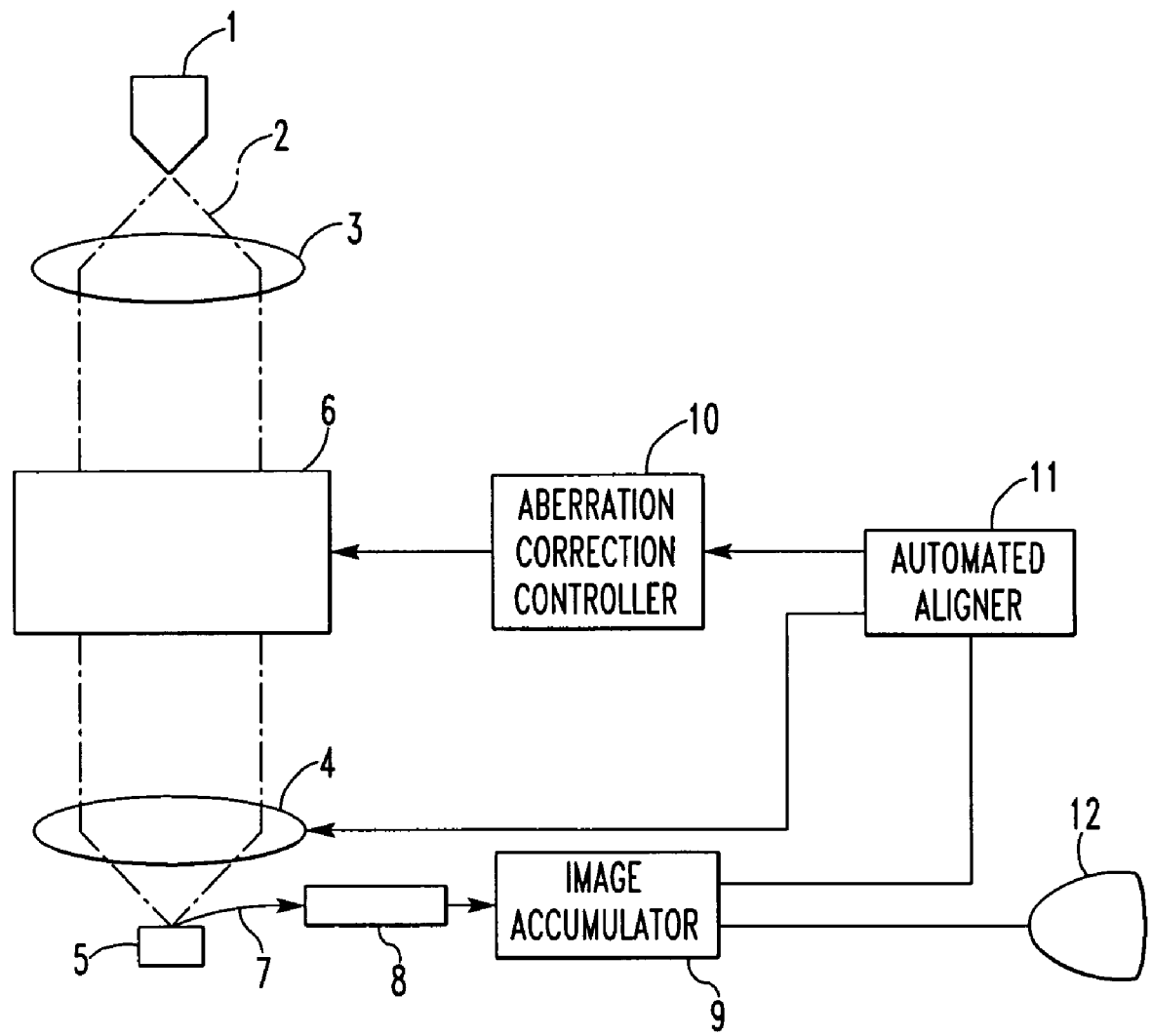
FIG. 1 is a schematic diagram showing an apparatus according to the present invention.
Figure 7:
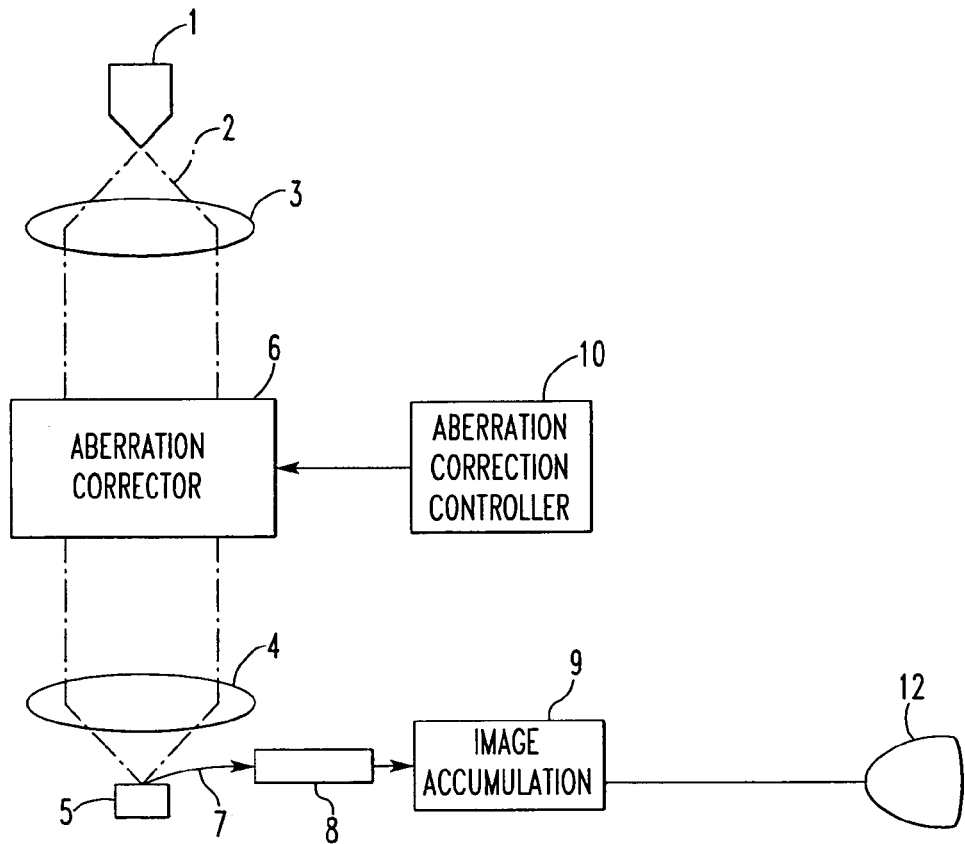
FIG. 7 is a diagram showing an example of configuration of the prior art apparatus.

FIG. 1 shows the configuration of an apparatus according to the present invention. Like components are indicated by like reference numerals in both FIGS. 1 and 7. In FIG. 1, an emitter 1 emits an electron beam (or a charged-particle beam) 2. A lens 3 acts on the beam 2. An aberration corrector 6 performs various corrections on the electron beam 2 undergoing a lens action from the lens 3. An objective lens 4 focuses the beam 2 onto a sample 5. Secondary electrons 7 are released from the sample 5. A secondary electron detector 8 detects the secondary electrons 7.

An image accumulator 9 accumulates images to obtain a secondary electron image in which noise has been reduced. An aberration correction controller 10 supplies control signals to the aberration corrector 6 to correct aberrations. An automated aligner 11 supplies an automated alignment control signal to the aberration correction controller 10 or to the objective lens 4. As an example, a computer is used as the automated aligner 11. A CRT (display device) 12 is connected with the image accumulator 9 to display various information.

In the present invention, a particle having a circular cross-sectional contour, such as a spherical particle, can be used as the sample 5. In particular, the controllability of the automated aligner 11 is improved if a spherical particle of gold or resin is used. The operation of the apparatus constructed in this way is described below.

The electron beam 2 is emitted from the emitter 1. The lens 3 controls the electron beam 2 incident on the aberration corrector 6. The beam 2 transmitted through the corrector 6 is focused onto the surface of the sample 5 by the lens action of the objective lens 4. The beam 2 is scanned across the surface of the sample. Secondary electrons 7 emitted from the surface of the sample 5 in synchronism with the scanning are detected by the secondary electron detector 8. Thus, the secondary electrons are displayed as a SEM image on the CRT 12 in synchronism with the scan signal. Since the effective signals of the secondary electrons detected by the secondary electron detector 8 are normally low, noise in the signals is removed by the image accumulator 9.

The aberration correction controller 10 controls the lens strength (focusing strength) of the aberration corrector 6. The automated aligner 11 obtains a SEM image from the image accumulator 9 and calculates a lens strength for correcting axial deviation of the aberration corrector 6. The aligner also calculates a lens strength for the multipole stages of the aberration corrector 6 for correcting the trajectory of the beam 2 in the aberration corrector 6 into a desired trajectory by means of the aberration corrector 6. After the calculations, the aligner 11 gives instructions to the aberration correction controller 10. The structure and operation of the aberration corrector 6 are described in detail in the above-cited reference which is incorporated herein by reference. The structure and operation of the automated aligner 11 according to the present invention are hereinafter described in detail by referring to FIG. 2.

Figure 2:
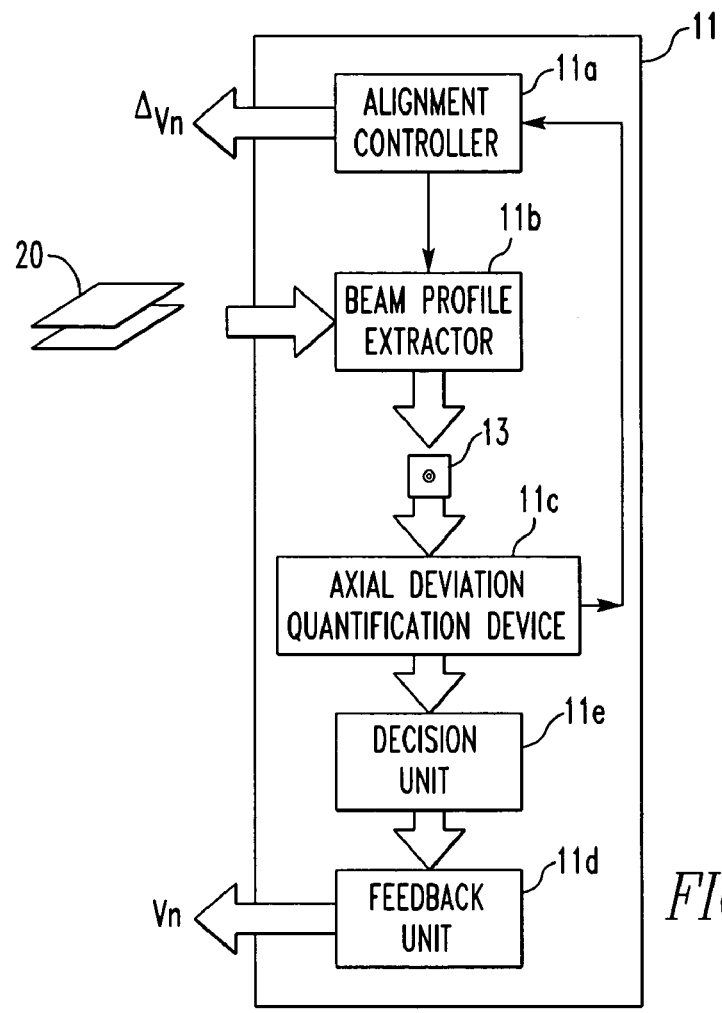
FIG. 2 is a diagram illustrating an exemplary configuration of an automated aligner.

FIG. 2 shows an example of configuration of the automated aligner 11. This aligner 11 has an alignment controller 11a producing a control signal $\Delta Vn$ for alignment control. A beam profile extractor 11b that is a device for obtaining information about a cross section of the beam receives the output from the alignment controller 11, receives the SEM image 20, and obtains information about the cross section of the beam. The beam profile extractor 11b outputs information about the beam profile 13 that is one kind of information about the beam cross section. An axial deviation quantification device 11c receives the beam profile 13 and quantifies the axial deviation of the optical axis of the electron beam 2 relative to the center of the multipole field in the aberration corrector 6. A decision unit 11e receives the output value from the axial deviation quantification device 11c and makes a decision as to whether feedback control is provided. A feedback unit 11d receives the output from the decision unit 11e and outputs a feedback control signal Vn. The operation of the apparatus constructed in this way in accordance with the present invention is next described.

The automated aligner 11 gives instructions to the aberration correction controller 10 to vary the strengths of plural dipole fields produced by multipole elements constituting the aberration corrector 6 to check the amount of axial deviation of the aberration corrector 6. Furthermore, the aligner 11 gives instructions to the aberration correction controller 10 to vary the strengths of lenses produced by plural multipole elements constituting the aberration corrector 6 for checking whether the electron beam 2 is in a given trajectory inside the corrector 6. The beam profile extractor 11b gains a SEM image when there is no change in the lens strengths and a SEM image when there is any change in the lens strengths in synchronism with the control signal $\Delta Vn$ from the alignment controller 11a for giving an instruction to vary the lens strengths, and calculates the beam profile (cross-sectional shape of the beam). A method of extracting the beam profile from the two SEM images is described in detail in U.S. Pat. No. 6,858,844. The method is described briefly herein.

Let g1 be a SEM image produced when the strength of a lens is varied. Let g0 be a SEM image produced when the strength of the lens is not varied. Let s be the transfer function of the sample surface. Let p1 be the beam profile when the lens strength is varied. Let p0 be the beam profile when the lens strength is not varied. The SEM images g1 and g0 are expressed respectively by $$g1 = s * p1 \tag{1}$$

$$g0 = s * p0 \tag{2}$$

where * indicates a convolution. Eqs. (3) and (4), shown below, are obtained by Fourier-transforming of Eqs. (1) and (2).

$$G1 = S \cdot P1 \tag{3}$$

$$G0 = S \cdot P0 \tag{4}$$

where · indicates a product in a Fourier space. Capital letters indicate results of Fourier transforms. Eq. (5), shown below, is obtained by eliminating S from Eqs. (3) and (4).

$$G1 = (P1 \cdot G0/P0) = P10 \cdot G0 \tag{5}$$

Here, we set P1/P0=P10. Inversely Fourier transforming Eq. (5) into a real space results in:

$$g1 = F^{-1}[P10 \cdot G0] \quad (6)$$

where $F^{-1}[\ ]$ indicates an inverse Fourier transform. Since P10 is a known function, the beam profile g1 can be calculated using Eq. (6) if G0 is known.

Figure 3:
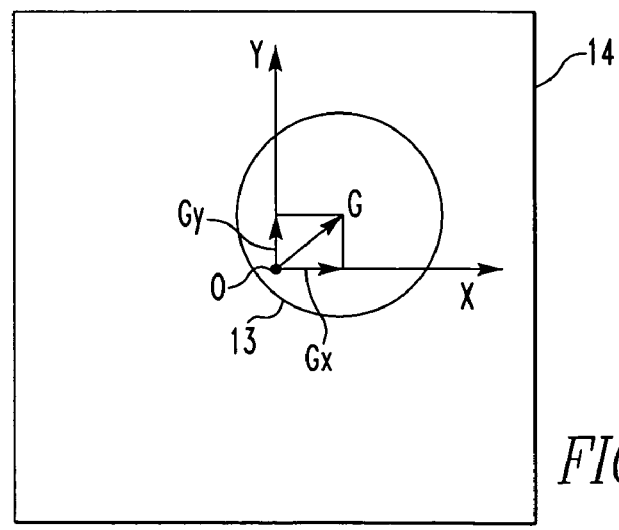
FIG. 3 is a diagram illustrating a method of quantification.

As an example, it is assumed that the beam profile g0 produced when there is no change in the beam strength is a function showing a Gaussian distribution. Since G0 is also a Gaussian distribution function, beam profile 13 (g1) can be calculated. As shown in FIG. 2, the axial deviation quantification device 11c quantifies the present amount of the axial deviation from the obtained beam profile 13 (g1). A method of the quantification is illustrated in FIG. 3. The center of the field of view (FOV) is taken at the origin O. Let G be the center of gravity of the beam profile 13 which shows the distribution of electron densities (distribution of particle densities) in the beam cross section. A vector OG is projected onto the X- and Y-axes. Let Gx[mode] be the deviation in the X-direction. Let Gy[mode] be the deviation in the Y-direction. Instead of the center of gravity, the geometric center of the outer periphery (contour) of the profile 13 can be used.

It is now assumed that Gx[mode] and Gy[mode] be functions of mode, which means discrimination of instructions from the alignment controller 11a. For example, "mode=1" means that the quadrupole field produced by the first stage of multipole elements of the aberration corrector 6 has been varied. The feedback unit 11d calculates the amount of feedback Vn[mode] from the quantified amount of axial deviation Gx[mode] and Gy[mode] using the Eqs. (7-1) and (7-2). The aberration correction controller 10 or objective lens 4 is informed of this amount of feedback Vn[mode]. Similarly, amount of feedback Vn indicates that it is a function of mode. Normally, the amount of feedback Vn has directionality. Let Vnx and Vny be the amounts of feedback in the X- and Y-directions, respectively.

$$Vnx[\text{mode}] = \alpha[\text{mode}] \times Gx[\text{mode}] \quad (7\text{-}1)$$

$$Vny[\text{mode}] = \beta[\text{mode}] \times Gy[\text{mode}] \quad (7\text{-}2)$$

where $\alpha[\text{mode}]$ and $\beta[\text{mode}]$ are similarly functions of mode.

In this way, according to the present invention, automated alignment can be made using an aberration corrector by using the center of gravity or geometric center as the position of the beam profile of the electron beam (charged-particle beam).

The decision unit 11e compares the amounts of axial deviations Gx[mode] and Gy[mode] discriminated using mode with their respective given threshold values. If the decision is that Gx and Gy are smaller than their threshold values, i.e., if the decision is that the axial deviation has been corrected, the correction is ended. If the decision is that the axial deviation has not been corrected sufficiently, the decision unit 11e instructs the alignment controller 11a to repeat these operations. As one method of control, if the following relations are satisfied by a threshold value $\gamma[\text{mode}]$ set for each mode, the control is judged to be ended.

$$|Gx[\text{mode}]| < \gamma[\text{mode}] \text{ and } |Gy[\text{mode}]| < \gamma[\text{mode}] \quad (8)$$

According to the present invention, axial deviation can be corrected well by making axial deviation corrections on Gx and Gy independently. Furthermore, according to the present invention, automated alignment is repeated until the quantified amount of axial deviation falls below a given threshold value. Consequently, the amount of axial deviation can be reduced sufficiently. In this case, it is possible to make an automatic decision as to whether the trajectory of the electron beam has been corrected well by comparing the quantified amount of axial deviation with a given threshold value.

Figure 8:
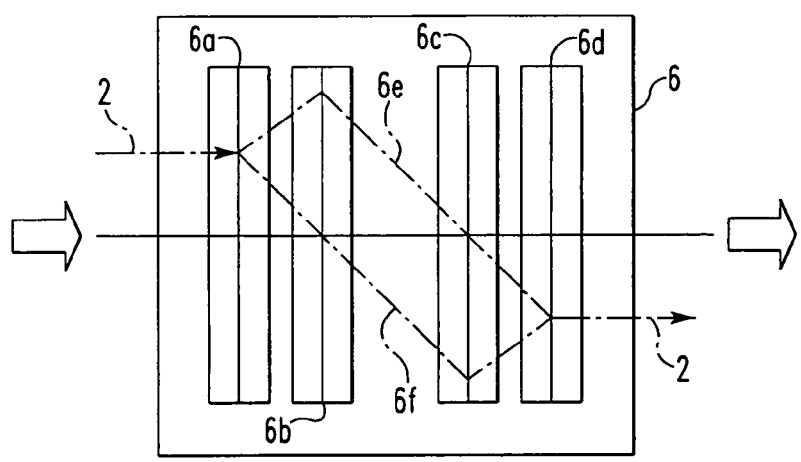
FIG. 8 is a diagram showing the configuration of an aberration corrector and the trajectory of an electron beam passing through the corrector.

A diagram of the aberration corrector 6 composed of four stages of multipole elements and the trajectory of the electron beam 2 passing through the corrector 6 are shown in FIG. 8. The four stages of multipole elements are shown to comprise first stage of multipole elements 6a, second stage of multipole elements 6b, third stage of multipole elements 6c, and fourth stage of multipole elements 6d. Normally, each stage of multipole elements has 8 or more multipole elements. In the present embodiment, each stage of multipole elements consists of 12 multipole elements. According to the above-cited Zach et al. reference, the beam 2 undergoes a focusing action and a dispersing action simultaneously from the first stage of multipole elements.

Referring to FIG. 8, it is assumed that the electron beam 2 that has undergone the dispersing action is in X trajectory 6e and that the electron beam 2 that has undergone the focusing action is in Y trajectory 6f. The lens strength of the first stage of multipole elements 6a is so adjusted that the Y trajectory 6f passes through the center of the multipole field (lens field) produced by the second stage of multipole elements 6b and becomes focused. The lens strength of the multipole elements 6b is so adjusted that the X trajectory 6e passes through the center of the multipole field (lens field) produced by the third stage of multipole elements 6c and becomes focused. At this time, in the second stage of multipole elements, the Y trajectory 6f passes through the center of the multipole field produced by the second stage of multipole elements 6b and thus is not affected by the multipole field produced by the second stage of multipole elements 6b. Only the X trajectory 6e undergoes the lens action.

Figure 4:
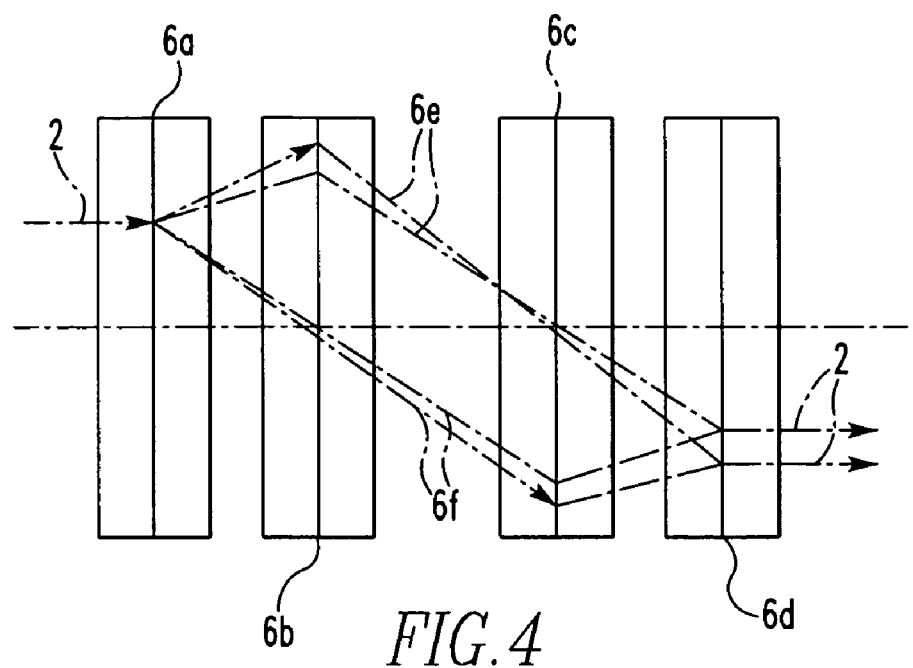
FIG. 4 is a diagram illustrating a case in which an electron beam has shifted out of its appropriate trajectory.

Similarly, in the third stage of multipole elements, the X trajectory 6e passes through the center of the multipole field (lens field) produced by the multipole element 6c and becomes focused. Therefore, the X-trajectory is not affected. Only the Y trajectory 6f undergoes the lens action. In this way, the Y trajectory 6f of the electron beam 2 must pass through the center of the multipole field produced by the second stage of multipole elements 6b and becomes focused. The X trajectory 6e must pass through the center of the multipole field produced by the third stage of multipole elements 6c and be focused. FIG. 4 illustrates a case where the electron beam has been shifted out of its trajectory by varying the lens strength of the first stage of multipole elements. The electron beam 2 passes through the center of the multipole field produced by the second stage of multipole elements 6b and passes through the center of the multipole field produced by the third stage of multipole elements 6c. However, the X trajectory 6e is not focused into the center of the multipole field produced by the third stage of multipole elements 6c. The Y trajectory 6f is not focused into the center of the multipole field produced by the second stage of multipole fields 6b.

In this case, the tilt and position of the electron beam 2 passed through the aberration corrector 6 vary. It follows that the obtained image blurs. Furthermore, the obtained image moves when the lens strength of each stage of multipole elements is varied unless the beam 2 passes through the centers of the multipole fields produced by the stages of multipole fields. In the technique disclosed in the above-cited Zach et al. reference, the beam 2 is controlled by the quadrupole field contained in the multipole fields produced by the stages of multipole fields. When the beam 2 does not pass through the center of the quadrupole field produced by the multipole elements, the center of the quadrupole field in the multipole fields produced by the first stage of multipole elements 6a can be found by (A) wobbling the quadrupole field contained in the multipole fields produced by the first stage of multipole elements 6a, (B) controlling the beam 2 with a deflector (not shown) on the side of the electron source of the aberration corrector 6, and (C) searching for a point at which the image does not move.

The center of the quadrupole field produced by the second stage of multipole elements 6b can be found by (A) wobbling the quadrupole field produced by the second stage of multipole elements 6b, (B) controlling the electron beam 2 by the dipole field (equivalent to deflection by a deflector) produced by the first stage of multipole elements 6a, and (C) searching for a point at which the image does not move. Similarly, the center of the quadrupole field produced by the third stage of multipole elements 6c and the center of the quadrupole field produced by the fourth stage of multipole elements 6d can be searched for. In addition, in order that the electron beam 2 passed through the aberration corrector 6 passes through the center of the lens field produced by the objective lens 4, the center of the lens field produced by the objective lens 4 can be searched for by wobbling the strength of the objective lens 4 and using the dipole field produced by the fourth stage of multipole elements 6d. In the present invention, these operations are performed by the automated aligner 11. For example, where the beam is passed through the center of the quadrupole field produced by the second stage of multipole elements 6b, an instruction is given to the aberration correction controller 10 such that the alignment controller I1a varies the strength of the quadrupole field produced by the second stage of multipole elements 6b in a corresponding manner to ΔVn in the automated aligner 11 shown in FIG. 2.

The aberration correction controller 10 controls the aberration corrector 6 to achieve the contents of the instruction. The corrector 6 varies the multipole field produced by the second stage of multipole elements 6b in a corresponding manner to ΔVn. As a result, the SEM image shifts. The beam profile extractor 11b receives the shifted SEM image, as well as the SEM image produced when the lens strength was not varied. The extractor 11b calculates the beam profile 13. The axial deviation quantification device 11c quantifies the amount of axial deviation. The feedback unit 11d calculates the amount of feedback provided by the first stage of multipole elements 6a to the dipole field and gives an instruction to the aberration corrector 6 or to the objective lens 4. The decision unit 11e gives an instruction to the alignment controller 11a to repeat the correction operations until the quantified amount of axial deviation satisfies Eq. (8).

Figure 9A:
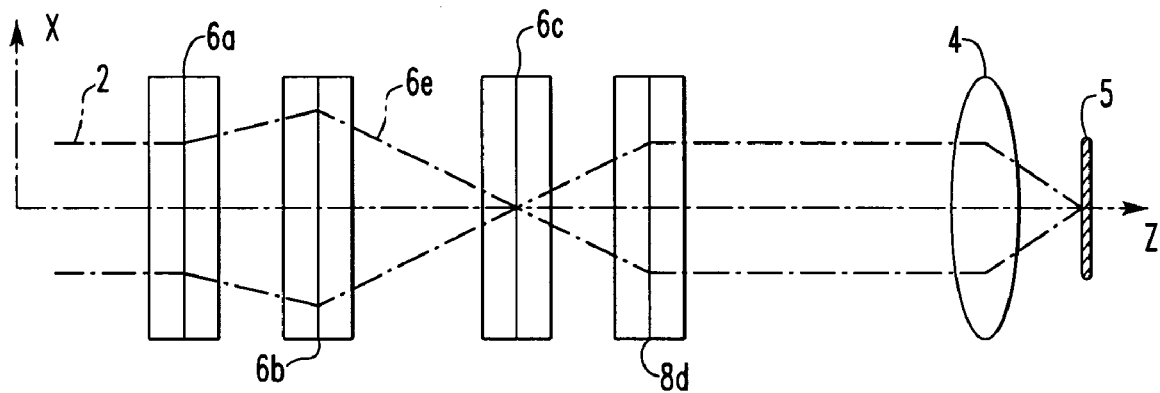
FIG. 9A is a diagram in which the trajectory of an electron beam is drawn on the X-Z planes.
Figure 9B:
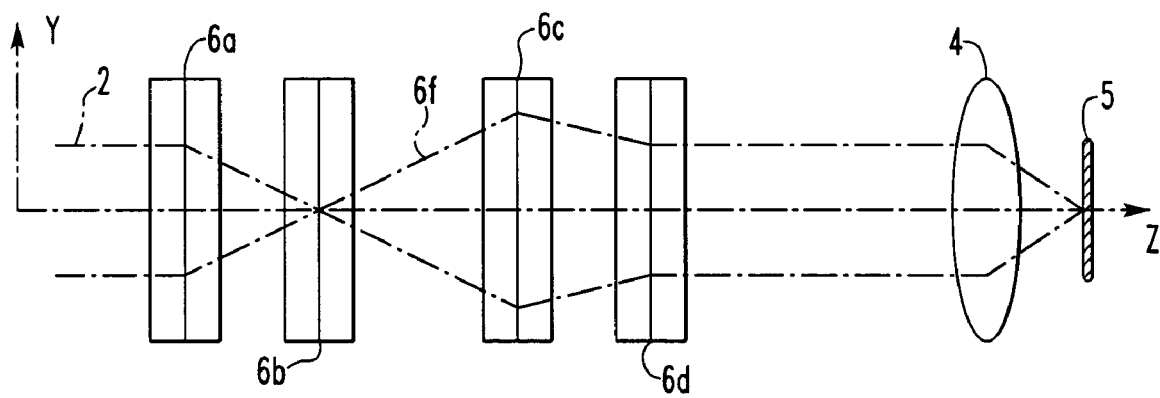
FIG. 9B is a diagram in which the trajectory is drawn on the Y-Z planes.

Additionally, the X trajectory must be focused into the center of the multipole field produced by the third stage of multipole elements 6c. Also, the Y trajectory must be focused into the center of the multipole field produced by the second stage of multipole elements 6b. The trajectory of the electron beam is shown in the X-Z plane and the Y-Z plane in FIGS. 9A and 9B. The X trajectory is shown in FIG. 9A. The Y trajectory is shown in FIG. 9B. decision is made as to whether the Y trajectory 6f is focused into the center of the multipole field produced by the second stage of multipole elements 6b depending on whether the electron beam 2 is focused into the center of the dipole field in the Y-direction in the multipole field produced by the multipole elements 6b.

Figure 5:
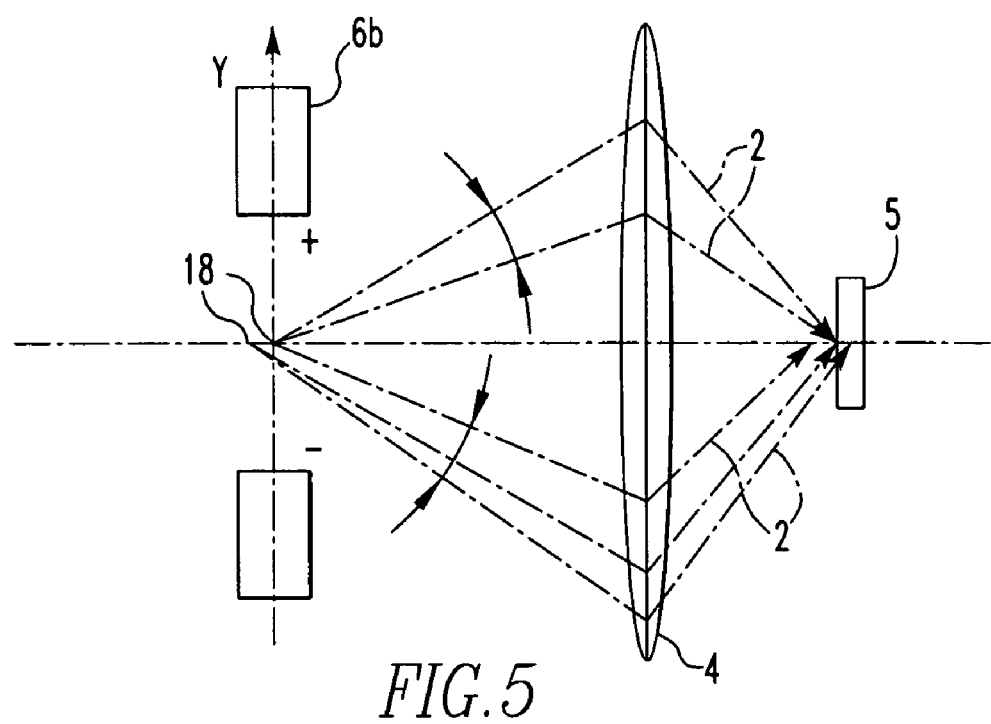
FIG. 5 is a diagram illustrating an trajectory of an electron beam.

That is, when the strength of the dipole field in the Y-direction produced by the second stage of multipole elements 6b is varied in a corresponding manner to ΔVn, if the Y trajectory 6f is focused into the center of the dipole field produced by the second stage of multipole elements 6b as shown in FIG. 5, the electron beam 2 passed through the aberration corrector 6 is brought to a focus at one point on the surface of the sample 5 by the objective lens 4 provided that the dipole field varies in strength. Consequently, the obtained SEM image does not move.

However, if the Y trajectory 6f is not focused into the center of the dipole field produced by the second stage of multipole elements 6b, an object point 18 shown in FIG. 5 will move when the strength of the multipole field produced by the second stage of multipole elements 6b is varied in a corresponding manner to ΔVn. As a result, the SEM image will shift. That is, the Y trajectory 6f is kept focused into the center of the multipole field produced by the second stage of multipole elements 6b by adjusting the strengths of the lens fields produced by the stages of multipole fields or lens field produced by the objective lens such that the SEM image does not move even if the strength of the dipole field produced by the second stage of multipole elements 6b is varied in a corresponding manner to ΔVn.

The SEM image can be fixed by adjusting the quadrupole field produced by the first stage of multipole elements 6a in this way. However, as shown in FIG. 4, a multipole field produced by multipole elements exerts a focusing action and a diverging action on the electron beam 2 simultaneously, affecting the X and Y axes. Therefore, the multipole fields produced by all the stages of multipole elements or the lens field produced by the objective lens must be adjusted finally.

The same theory applies to the case where the X trajectory 6e is focused into the center of the multipole field produced by the third stage of multipole elements 6c. That is, the strengths of the multipole fields produced by the stages of multipole elements or the strength of the lens field produced by the objective lens is adjusted such that the SEM image does not shift if the dipole field produced by the third stage of multipole elements 6c is varied.

In the present invention, these operations are performed by the automated aligner 11. As an example, when the Y trajectory 6f is not focused on the center of the multipole field produced by the second stage of multipole elements 6b, an instruction is given to the aberration correction controller 10 such that the alignment controller 11a varies the strength of the dipole field in the Y-direction produced by the second stage of multipole elements 6b in a corresponding manner to ΔVn in the automated aligner 11 shown in FIG. 2. The aberration correction controller 10 controls the aberration corrector 6 to achieve the contents of the instruction. The aberration corrector 6 varies the strength of the dipole field in the Y-direction produced by the second stage of multipole elements 6b in a corresponding manner to ΔVn. As a result, the SEM image is shifted. The beam profile extractor 11b receives the shifted SEM image, as well as a SEM image produced when the strength was not varied. The extractor 11b extracts the beam profile 13. The axial deviation quantification device 11c quantifies the amount of axial deviation. The feedback unit 11d calculates the amount of feedback to the multipole fields produced by the stages of multipole elements or to the lens field produced by the objective lens. The feedback unit then gives an instruction to the aberration correction controller 10 or to the objective lens. The decision unit 11e gives an instruction to the alignment controller 11a such that it repeats the correction operations until the quantified amount of axial deviation satisfies Eq. (8).

According to the present invention, an image of a surface of a sample can be obtained under the condition where a lens strength has been varied. Furthermore, the amount of axial deviation of the apparatus can be found by using one or two extracted beam profiles (i.e., information about the beam cross section) of a charged-particle beam and multiplying the difference between the position of the center of gravity and the origin by a certain constant. Moreover, the amount of axial deviation of the apparatus can be found by using one or two extracted beam profiles of the charged-particle beam and multiplying the difference between the position of the center and the origin by a certain constant. Further, according to the present invention, automated alignment can be performed using an aberration corrector by obtaining an amount of axial deviation, multiplying the amount of axial deviation by a certain constant, and applying feedback to the aberration corrector or objective lens according to the calculated product.

In this way, the automated aligner 11 according to the present invention performs plural alignments, which are discriminated using the value of mode, for example, as described below.

mode=1: The electron beam is passed through the center of a multipole field produced by the first stage of multipole elements.

mode=2: The electron beam is passed through the center of a multipole field produced by the second stage of multipole elements.

mode=3: The electron beam is passed through the center of a multipole field produced by the third stage of multipole elements.

mode=4: The electron beam is passed through the center of a multipole field produced by the fourth stage of multipole elements.

mode=5: The electron beam is passed through the center of a lens field produced by the objective lens.

mode=6: The Y trajectory is focused into the center of a multipole field produced by the second stage of multipole elements.

mode=7: The X trajectory is focused into the center of a multipole field produced by the third stage of multipole elements.

The alignment controller 11a is monitoring the alignment conditions made with mode=1 to 7. The sequence of operations is repeated until all the conditions are satisfied. Alignment operations may be performed in numerical order of the value of mode, although this is not essential.

The electron beam is passed through the center of each multipole field produced by the multipole elements. It is now assumed that mode assumes values from 1 to 5. Where mode=1, amounts of feedback Vnx[mode=1] and Vny[mode=1] calculated using Eqs. (7-1) and (7-2) are applied, respectively, to X and Y deflectors (not shown) located at the side of the emitter 1 on the aberration corrector 6.

Where mode=2, amounts of feedback Vnx[mode=2] and Vny[mode=2] calculated using Eqs. (7-1) and (7-2) are applied, respectively, to X- and Y-direction dipole fields produced by the first stage of multipole elements 6a in the aberration corrector 6.

Where mode=3, amounts of feedback Vnx[mode=3] and Vny[mode=3] calculated using Eqs. (7-1) and (7-2) are applied, respectively, to X- and Y-direction dipole fields produced by the second stage of multipole elements 6b in the aberration corrector 6.

Where mode=4, amounts of feedback Vnx[mode=4] and Vny[mode=4] calculated using Eqs. (7-1) and (7-2) are applied, respectively, to X- and Y-direction dipole fields produced by the third stage of multipole elements 6c in the aberration corrector 6.

Where mode=5, amounts of feedback Vnx[mode=5] and Vny[mode=5] calculated using Eqs. (7-1) and (7-2) are applied, respectively, to X- and Y-direction dipole fields produced by the fourth stage of multipole elements 6d in the aberration corrector 6.

The focal point of the Y trajectory can be moved near the center of the multipole field produced by the second stage of multipole elements 6b while the X trajectory is kept focused in the center of the multipole field produced by the third stage of multipole elements 6c, by fixing the ratio of the applied lens strengths of the quadrupole fields produced by the first, second, and third stages of multipole fields at Ay:By:Cy. In order to fulfill the condition that the Y trajectory is focused into the center of a multipole field produced by the second stage of multipole elements 6b, the amount of feedback Vny[mode=6] calculated using Eq. (7-2) is applied to the quadrupole fields produced by the first, second, and third stages of multipole elements according to the applied lens strength ratio Ay:By:Cy.

In particular, Ay·Vny is applied to the quadrupole field produced by the first stage of multipole elements 6a. By·Vny is applied to the quadrupole field produced by the second stage of multipole elements 6b. Cy·Vny is applied to the quadrupole field produced by the third stage of multipole elements 6c.

The lens strength ratio is 4:−1:−1, for example. However, the invention is not limited to this ratio. When the lens strength ratio of the quadrupole field produced by the first stage of multipole elements 6a is experimentally set to Ay, the lens strengths of the quadrupole field produced by the second stage of multipole elements 6b and the quadrupole field produced by the third stage of multipole elements 6c may be set to By and Cy, respectively, such that the image is again focused.

Similarly, the focal point of the X trajectory can be moved near the center of the multipole field produced by the third stage of multipole elements 6c while maintaining the Y trajectory in focus at the center of the multipole field produced by the second stage of multipole elements 6b, by fixing the applied lens strength ratio of the quadrupole fields produced by the second, third, and fourth stages of multipole elements to Bx:Cx:Dx. In order to fulfill the X trajectory is focused into the center of the multipole field produced by the third stage of multipole elements 6c, the amount of feedback Vnx[mode=7] calculated using Eq. (7-1) is applied to the quadrupole fields produced by the second, third, and fourth stages of multipole elements according to the applied lens strength ratio Bx:Cx:Dx.

That is, Bx·Vnx, Cx·Vnx, and Dx·Vnx are applied, respectively, to the quadrupole fields produced by the second, third, and fourth stages of multipole elements 6b, 6c, and 6d, respectively.

The lens strength ratio is −1:−1:4, for example, although the invention is not limited to this. When the lens strength ratio of the quadrupole field produced by the fourth stage of multipole elements 6d is experimentally set to Dx, the lens strengths of the quadrupole field produced by the second stage of multipole elements 6b and the quadrupole field produced by the third stage of multipole elements 6c may be set to Bx and Cx, respectively, such that the image is again focused.

Another method of focusing the X trajectory into the center of a multipole field produced by the third stage of multipole elements 6c is as follows. The focal point of the X trajectory can be moved near the center of the multipole field produced by the third stage of multipole elements 6d while maintaining the Y trajectory in focus in the center of the multipole field produced by the second stage of multipole elements 6b by fixing the lens strength ratios of the quadrupole fields produced by the second and third stages of multipole elements at Bx:Cx. The amount of feedback Vnx[mode=7] calculated using Eq. (7-1) is applied to the quadrupole fields produced by the second and third stages of multipole elements according to the applied lens strength ratio Bx:Cx. At this time, the image is out of focus at the sample position. However, a correction can be made by adjusting the strength of the lens field produced by the objective lens 4 in order to make the image come into focus again. Accordingly, as an overall operation, the strength of the quadrupole field produced by the second stage of multipole elements 6b, the strength of the quadrupole field produced by the third stage of quadrupole field, and the strength of the applied lens field produced by the objective lens are fixed at Bx:Cx:Ox and feedback is provided to them.

That is, Bx·Vnx, Cx·Vnx, and Ox·Vnx are applied, respectively, to the quadrupole field produced by the second stage of quadrupole multipole elements 6b, the quadrupole field produced by the third stage of multipole elements 6c, and the lens field produced by the objective lens.

The lens strength ratio is −1:1:Ox, for example, though the invention is not limited to this ratio. When the lens strength ratio of the lens field produced by the objective lens is experimentally set to Ox, the lens strengths of the quadrupole field produced by the second stage of multipole elements 6b and the quadrupole field produced by the third stage of multipole elements 6c may be set to Bx and Cx, respectively, such that the image is again focused.

According to the present invention, automated alignment can be performed using an aberration corrector by using two, three, or five sample surface images. Furthermore, automated alignment can be performed with an aberration corrector using an image obtained under the condition where the lens strength of the aberration corrector is shifted by a given amount as well as an image obtained under the present value. Furthermore, automated alignment can be performed with an aberration corrector using an image obtained under the condition where a lens strength of the aberration corrector has been shifted in the X- and Y-directions by given amounts as well as an image obtained under the present value. In addition, automated alignment can be performed with an aberration corrector consisting of four stages of multipole elements. Further, automated alignment can be performed with an aberration corrector consisting of four stages of multipole elements each of which has four or more poles. Especially, in the above-described embodiments, each of the multipole elements constituting the aberration corrector has twelve poles. Automated alignment can also be performed with an aberration corrector consisting of four stages of multipole elements each of which is a dipole element, quadrupole element, hexa-pole element, or octupole element.

As described so far, according to the present invention, a normal operator can perform automated corrections of alignment of an aberration corrector unconsciously of the corrector.

Figure 6:
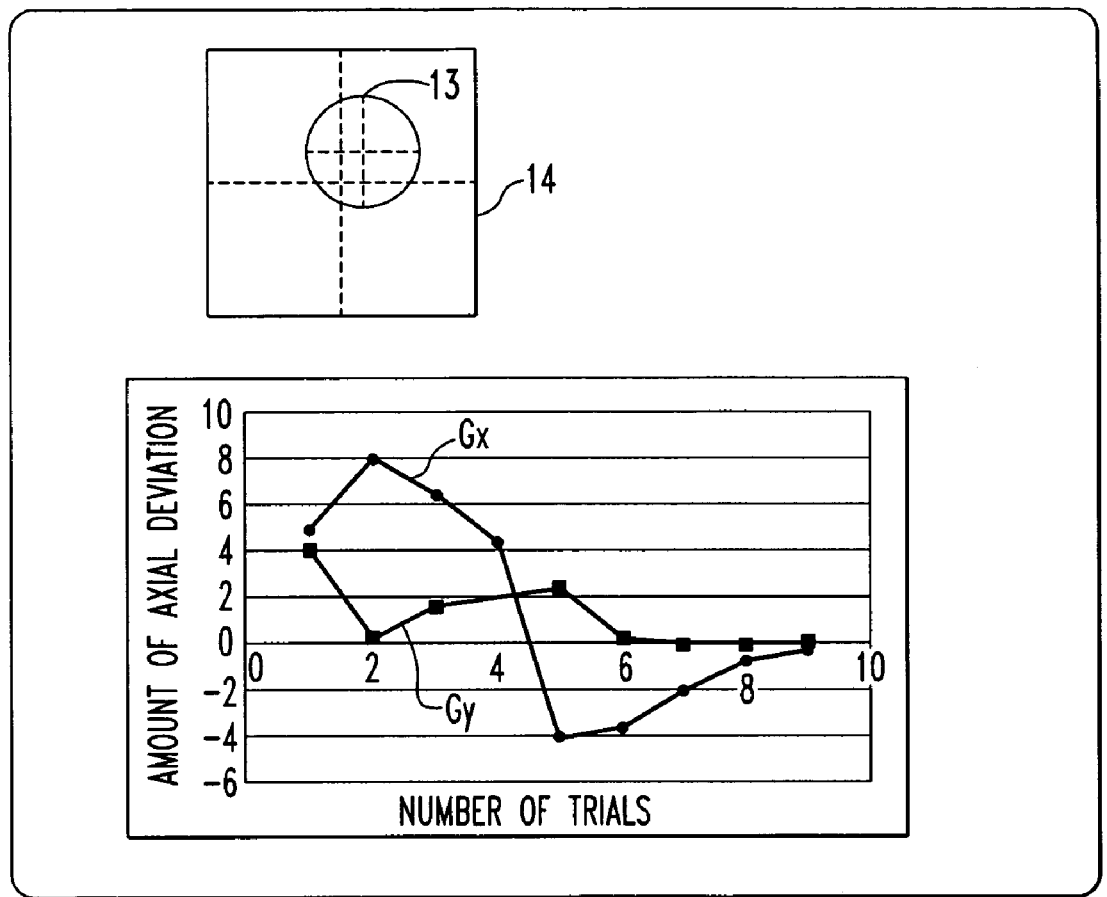
FIG. 6 is a diagram illustrating the manner in which a display is provided by a method according to the present invention.

Furthermore, according to the present invention, the present amount of axial deviation is quantified and so the apparatus can assist the operator by displaying the state of operation of the automated aligner 11 (e.g., the histories of the beam profile 13 and the amount of axial deviation of the apparatus on the graphical user interface (GUI) 15 on the CRT 12 as shown in FIG. 6). The FOV of the beam profile is indicated by 14. Gx in the figure shows that the amount of axial deviation decreases gradually with increasing the number of trials. Gy indicates that the amount of axial deviation increases after a lapse of a certain time and then decreases.

As described so far, the method of automatically correcting a charged-particle beam in accordance with the present invention comprises the steps of: irradiating a sample with the charged-particle beam via an aberration corrector and an objective lens, the aberration corrector having multipole elements; obtaining information about a cross section of the charged-particle beam based on plural images of a surface of the irradiated sample; calculating an amount of axial deviation of the optical axis of the beam relative to the center of a multipole field in the aberration corrector based on the obtained information about the cross section of the beam; and automatically applying feedback to the aberration corrector or to the objective lens according to the calculated amount of axial deviation.

The apparatus for automatically correcting a charged-particle beam in accordance with the present invention comprises: an aberration corrector having multipole elements; means for obtaining information about a cross section of the charged-particle beam based on plural images of a surface of a sample irradiated with the beam via the aberration corrector and an objective lens; means for calculating an amount of axial deviation of the optical axis of the beam relative to the center of a multipole field in the aberration corrector based on the obtained information about the cross section of the beam; and feedback means for automatically applying feedback to the aberration corrector or to the objective lens according to the calculated amount of axial deviation.

The number of used images of a surface of a sample may be any one of two, three, and five.

Where the number of images of the surface of the sample is two, a first one of the images can be obtained when the lens strength of the aberration corrector is set to a first value, and a second one of the images can be obtained when the lens strength is set to a second value shifted from the first value by a given amount.

Where the number of images of the surface of the sample is three, a first one of the images can be obtained when the lens strength of an aberration corrector is set to a first value, a second one of the images can be obtained when the lens strength is set to a second value shifted from the first value by a first given amount in an X-direction, and a third one of the images can be obtained when the lens strength is set to a third value shifted from the first value by a second given amount in a Y-direction.

Where the number of images of the surface of the sample is five, a first one of the images can be obtained when the lens strength of the aberration corrector is set to a first value, a second one of the images can be obtained when the lens strength is set to a second value shifted from the first value by a first positive given amount in an X-direction, a third one of the images can be obtained when the lens strength is set to a third value shifted from the first value by a second negative given amount in the X-direction, a fourth one of the images can be obtained when the lens strength is set to a fourth value shifted from the first value by a third positive given amount in a Y-direction, and a fifth one of the images can be obtained when the lens strength is set to a fifth value shifted from the first value by a fourth negative given amount in the Y-direction.

The aberration corrector can be equipped with four stages of multipole elements.

At this time, each stage of the four stages of multipole elements constituting the aberration corrector can be equipped with four or more multipole elements.

Furthermore, the aberration corrector can be equipped with four stages of multipole elements. Any one of dipole field produced by the stages of multipole elements in the aberration corrector, quadrupole field produced by the stages of multipole elements, hexa-pole field produced by the stages of multipole elements, octupole field produced by the stages of multipole elements, and lens field produced by the objective lens can be shifted in strengths.

An image of the surface of the sample can also be obtained simultaneously with variation of the strength of any one of the fields.

Furthermore, information about one or two cross sections of a charged-particle beam can be obtained. The amount of axial deviation can be calculated by multiplying the difference between the center of gravity of the distribution of particle densities contained in the obtained information about one or two cross sections and the position of the origin contained in the information about the cross sections by a constant value.

Additionally, information about one or two cross sections of a charged-particle beam can be obtained. The amount of axial deviation can be calculated by multiplying the difference between the center position of the cross-sectional contour of the beam contained in the obtained information about one or two cross sections and the position of the origin contained in the information about the cross sections by a constant value.

At this time, feedback may be applied to the aberration corrector or to the objective lens in proportion to the obtained amount of axial deviation.

Further, the aberration corrector can be equipped with four stages of multipole elements. Feedback can be applied to any one of dipole field produced by the stages of multipole elements in the aberration corrector, quadrupole field produced by the stages of multipole elements, and lens field produced by the objective lens.

Yet further, a decision as to whether the optical axis of the charged-particle beam has been corrected so as to enter a given range can be automatically made by comparing the amount of axial deviation with a threshold value.

At this time, the processing for automated correction can be repeated until the amount of axial deviation falls below the threshold value.

Yet additionally, the sample can be a reference sample. The sample can be made movable between a first position in a sample chamber where the sample is irradiated with the beam and a second position where the sample is on standby for transfer to the first position.

The sample can be a particle having a circular cross-sectional contour.

The sample can be a spherical particle made of gold or resin.

The axial deviation can be corrected in X- and Y-directions independently.

The obtained information about the cross section of the charged-particle beam and the calculated amount of axial deviation can be displayed.

Another apparatus for automatically correcting a charged-particle beam in accordance with the present invention comprises: an aberration corrector equipped with multipole elements and acting to correct aberration in the charged-particle beam; an aberration correction controller for controlling the strength of a multipole field produced by the aberration corrector; an objective lens; a control unit for supplying a control signal to the aberration correction controller or to the objective lens; cross-sectional information-obtaining device for obtaining a SEM image in synchronism with operation of the control unit and obtaining information about a cross section of the charged-particle beam; an axial deviation quantification device for quantifying the amount of the axial deviation of the optical axis of the beam from the obtained information about the cross section of the beam; a decision unit for making a decision from the quantified amount of axial deviation as to whether automated correction is made; and a feedback device for outputting an amount of feedback to the aberration correction controller or to the objective lens from the quantified amount of axial deviation.

In a method of controlling an aberration corrector for a charged-particle beam in accordance with the present invention, the aberration corrector is made up of plural stages of multipole elements. A control unit controls the whole aberration corrector as a single lens. During this control, the lens strength ratio of the stages of multipole lenses is kept constant.

In another method of controlling an aberration corrector for a charged-particle beam in accordance with the present invention, the aberration corrector is made up of plural stages of multipole elements. A control unit controls the whole aberration corrector as a single lens. During this control, the lens strength ratio of the stages of multipole lenses and objective lens is kept constant.

Feedback may be applied by the control unit either to a lens formed in such a way that the lens strength ratio of the stages of multipole elements in the aberration corrector is kept constant or to a lens formed in such a way that the lens strength ratio of the stages of multipole elements and objective lens is kept constant.

Having thus described our invention with the detail and particularity required by the Patent Laws, what is desired protected by Letters Patent is set forth in the following claims.

The invention claimed is:

1. A method of automatically correcting a charged-particle beam, comprising the steps of:
    irradiating a sample with the charged-particle beam via an aberration corrector and an objective lens, the aberration corrector having multipole elements;
    obtaining information about a cross section of the charged-particle beam based on plural images of a surface of the irradiated sample;
    calculating an amount of axial deviation of the optical axis of the charged-particle beam relative to the center of a multipole field in the aberration corrector based on the obtained information about the cross section of the beam; and
    automatically applying feedback to the aberration corrector or to the objective lens according to the calculated amount of axial deviation.

2. An apparatus for automatically correcting a charged-particle beam, comprising:
    an aberration corrector equipped with multipole elements;
    irradiation means for irradiating a sample with the charged-particle beam via the aberration corrector and an objective lens;

cross-sectional information-obtaining means for obtaining information about a cross section of the charged-particle beam based on plural images of a surface of the irradiated sample;

calculation means for calculating an amount of axial deviation of the optical axis of the charged-particle beam relative to the center of a multipole field in the aberration corrector, based on the obtained information about the cross section of the beam; and feedback means for automatically applying feedback to the aberration corrector or to the objective lens according to the calculated amount of axial deviation.

3. An apparatus for automatically correcting a charged-particle beam as set forth in claim 2, wherein the number of used images of the surface of the sample is any one of two, three, and five.

4. An apparatus for automatically correcting a charged-particle beam as set forth in claim 3, wherein the number of the used images of the surface of the sample is two, and wherein a first one of the images is obtained when the focusing strength of the aberration corrector is set to a first value and a second one of the images is obtained when the focusing strength is set to a second value shifted from the first value by a given amount.

5. An apparatus for automatically correcting a charged-particle beam as set forth in claim 3, wherein the number of the used images of the surface of the sample is three, and wherein a first one of the images is obtained when the focusing strength of the aberration corrector is set to a first value, a second one of the images is obtained when the focusing strength is set to a second value changed from the first value by a first given amount in an X-direction, and a third one of the images is obtained when the focusing strength is set to a third value changed from the first value by a second given amount in a Y-direction.

6. An apparatus for automatically correcting a charged-particle beam as set forth in claim 3, wherein the number of the used images of the surface of the sample is five, and wherein a first one of the images is obtained when the focusing strength of the aberration corrector is set to a first value, a second one of the images is obtained when the focusing strength is set to a second value changed from the first value by a first positive given amount in an X-direction, a third one of the images is obtained when the focusing strength is set to a third value changed from the first value by a second negative given amount in the X-direction, a fourth one of the images is obtained when the focusing strength is set to a fourth value changed from the first value by a third positive given amount in a Y-direction, and a fifth one of the images is obtained when the focusing strength is set to a fifth value changed from the first value by a fourth negative given amount in the Y-direction.

7. An apparatus for automatically correcting a charged-particle beam as set forth in claim 2, wherein said aberration corrector is equipped with four stages of multipole elements.

8. An apparatus for automatically correcting a charged-particle beam as set forth in claim 7, wherein each of the four stages of multipole elements constituting said aberration corrector has at least four pole elements.

9. A method of automatically correcting a charged-particle beam as set forth in claim 1, wherein said aberration corrector is equipped with four stages of multipole elements, and wherein any one of dipole field produced by the stages of multipole elements in the aberration corrector, quadrupole field produced by the stages of multipole elements, hexapole field produced by the stages of multipole elements, octupole field produced by the stages of multipole elements, and focusing field produced by the objective lens is changed in strength.

10. A method of automatically correcting a charged-particle beam as set forth in claim 9, wherein each image of the surface of the sample is obtained in synchronism with the changing of the strength of any one of the fields.

11. An apparatus for automatically correcting a charged-particle beam as set forth in claim 2, wherein information about one or two cross sections of the charged-particle beam is obtained, and wherein said amount of axial deviation is calculated by multiplying the difference between the center of gravity of distribution of particle densities contained in the obtained information about one or two cross sections of the beam and the position of the origin contained in the information about the cross sections by a constant value.

12. An apparatus for automatically correcting a charged-particle beam as set forth in claim 2, wherein information about one or two cross sections of the charged-particle beam is obtained, and wherein said amount of axial deviation is calculated by multiplying the difference between the center position of the cross-sectional contour of the beam contained in the obtained information about one or two cross sections of the beam and the position of the origin contained in the information about the cross sections by a constant value.

13. An apparatus for automatically correcting a charged-particle beam as set forth in claim 2, wherein feedback is applied to the aberration corrector or to the objective lens in proportion to the obtained amount of axial deviation.

14. An apparatus for automatically correcting a charged-particle beam as set forth in claim 13, wherein said aberration corrector is equipped with four stages of multipole elements, and wherein feedback is applied to any one of dipole field produced by the stages of multipole elements in the aberration corrector, quadrupole field produced by the stages of multipole elements, and focusing field produced by the objective lens.

15. An apparatus for automatically correcting a charged-particle beam as set forth in claim 2, wherein a decision as to whether the optical axis of the charged-particle beam has been corrected so as to enter a given range is automatically made by comparing the amount of axial deviation with a threshold value.

16. An apparatus for automatically correcting a charged-particle beam as set forth in claim 15, wherein processing for automated correction is repeated until said amount of axial deviation falls below the threshold value.

17. An apparatus for automatically correcting a charged-particle beam as set forth in claim 2, wherein said sample is a reference sample, and wherein the sample is moved between a first position in a sample chamber where the sample is irradiated with the charged-particle beam and a second position where the sample is on standby for transfer to the first position.

18. An apparatus for automatically correcting a charged-particle beam as set forth in claim 2, wherein said sample is a reference sample, and wherein the sample is a particle having a circular cross-sectional contour.

19. An apparatus for automatically correcting a charged-particle beam as set forth in claim 2, wherein said sample is a reference sample, and wherein the sample can be a spherical particle made of gold or resin.

20. An apparatus for automatically correcting a charged-particle beam as set forth in claim 2, wherein the axial deviation is corrected in X- and Y-directions independently.

21. An apparatus for automatically correcting a charged-particle beam as set forth in claim 2, wherein the obtained information about the cross sections of the charged-particle beam and the calculated amount of axial deviation are displayed.

22. An apparatus for automatically correcting a charged-particle beam, said apparatus comprising:
- an aberration corrector equipped with multipole elements and acting to correct aberration in the charged-particle beam;
- an aberration correction controller for controlling the strength of a multipole field produced by the aberration corrector;
- an objective lens;
- a control unit for supplying a control signal to the aberration correction controller or to the objective lens;
- cross-sectional information-obtaining device for obtaining a SEM image in synchronism with operation of the control unit and obtaining information about a cross section of the charged-particle beam;
- an axial deviation quantification device for quantifying the amount of the axial deviation of the optical axis of the beam from the obtained information about the cross section of the beam;
- a decision unit for making a decision from the quantified amount of axial deviation as to whether automated correction is completed; and
- a feedback device for outputting an amount of feedback to the aberration correction controller or to the objective lens from the quantified amount of axial deviation.

23. A method of controlling an aberration corrector for a charged-particle beam, the corrector being made up of plural stages of multipole elements, wherein a control unit controls the whole aberration corrector as a single lens, and wherein during the control, the lens strength ratio of the stages of multipole lenses is kept constant.

24. A method of controlling an aberration corrector for a charged-particle beam, the corrector being made up of plural stages of multipole elements, wherein a control unit controls the whole aberration corrector as a single lens, and wherein during the control, the lens strength ratio of the stages of multipole lenses and the objective lens is kept constant.

25. A method of controlling an aberration corrector for a charged-particle beam as set forth in claim 23, wherein feedback is applied by said control unit either to a lens formed in such a way that the lens strength ratio of the stages of multipole elements in the aberration corrector is kept constant or to a lens formed in such a way that the lens strength ratio of the stages of multipole elements and objective lens is kept constant.

26. A method of controlling an aberration corrector for a charged-particle beam as set forth in claim 24, wherein feedback is applied by said control unit either to a lens formed in such a way that the lens strength ratio of the stages of multipole elements in the aberration corrector is kept constant or to a lens formed in such a way that the lens strength ratio of the stages of multipole elements and objective lens is kept constant.

* * * * *

UNITED STATES PATENT AND TRADEMARK OFFICE
CERTIFICATE OF CORRECTION

PATENT NO. : 7,355,175 B2
APPLICATION NO. : 11/293846
DATED : April 8, 2008
INVENTOR(S) : Honda et al.

It is certified that error appears in the above-identified patent and that said Letters Patent is hereby corrected as shown below:

On the Title Page, INSERT:

Item -- (30) References Cited, Foreign Application Priority Data:
December 7, 2004 (JP) . . . . . . . . . . . . . . . . . 2004-354143 --

Signed and Sealed this

Thirtieth Day of September, 2008

JON W. DUDAS
*Director of the United States Patent and Trademark Office*